US008133002B2

(12) United States Patent
Jonas et al.

(10) Patent No.: US 8,133,002 B2
(45) Date of Patent: Mar. 13, 2012

(54) METHOD FOR FORMING A BACK-TO-BACK WAFER BATCH TO BE POSITIONED IN A PROCESS BOOT, AND HANDLING SYSTEM FOR FORMING THE BTB WAFER BATCH

(75) Inventors: Stefan Jonas, Berlin (DE); Lutz Redmann, Kleinmachnow (DE)

(73) Assignee: Jonas & Redmann Automationstechnik GmbH, Berlin (DE)

( * ) Notice: Subject to any disclaimer, the term of this patent is extended or adjusted under 35 U.S.C. 154(b) by 580 days.

(21) Appl. No.: 12/307,011

(22) PCT Filed: Nov. 22, 2007

(86) PCT No.: PCT/EP2007/010364
§ 371 (c)(1),
(2), (4) Date: Dec. 30, 2008

(87) PCT Pub. No.: WO2008/061806
PCT Pub. Date: May 29, 2008

(65) Prior Publication Data
US 2009/0281653 A1    Nov. 12, 2009

(30) Foreign Application Priority Data
Nov. 24, 2006  (EP) .................................. 06077093

(51) Int. Cl.
*B65G 65/00*    (2006.01)
(52) U.S. Cl. ........................................ 414/810; 414/404

(58) Field of Classification Search .................. 414/404, 414/416.02, 810
See application file for complete search history.

(56) References Cited

U.S. PATENT DOCUMENTS

| | | | | |
|---|---|---|---|---|
| 5,261,776 A * | 11/1993 | Burck et al. | ............. | 414/416.09 |
| 6,612,801 B1 * | 9/2003 | Koguchi | .................. | 414/416.02 |
| 7,052,739 B2 * | 5/2006 | Buitron et al. | ............. | 427/430.1 |
| 7,083,376 B2 * | 8/2006 | Crofton et al. | ................ | 414/811 |
| 7,367,773 B2 * | 5/2008 | Buitron et al. | ................. | 414/806 |
| 7,600,359 B2 * | 10/2009 | Buitron | ........................... | 53/446 |
| 7,789,615 B2 * | 9/2010 | Buitron et al. | ................ | 414/811 |
| 2004/0071535 A1 * | 4/2004 | Crofton et al. | ........... | 414/416.09 |

FOREIGN PATENT DOCUMENTS

JP            63084043        4/1988
* cited by examiner

*Primary Examiner* — Charles A Fox
(74) *Attorney, Agent, or Firm* — Notaro, Michalos & Zaccaria P.C.

(57) ABSTRACT

A method of forming stacks of wafers. One half of the number of the wafers provided serially in the transfer carrier is transferred out of the transfer carrier in the form of a first wafer stack in a mounted standby position located outside of the transfer carrier, then the other half of the number of wafers serially provided in the transfer carrier is moved out of the transfer carrier in the form of a second wafer stack and the second wafer stack is swiveled so that the wafers of the second wafer stack reach a position swiveled by 180° in relation to the position of the wafers of the first wafer stack in its standby position. The second wafer stack is transferred to the standby position of the first wafer stack, aligned to it and then joined together as form fitting with the first wafer stack.

7 Claims, 12 Drawing Sheets

METHOD FOR FORMING A BACK-TO-BACK WAFER BATCH TO BE POSITIONED IN A PROCESS BOOT, AND HANDLING SYSTEM FOR FORMING THE BTB WAFER BATCH

FIELD AND BACKGROUND OF THE INVENTION

The invention relates to a method of forming a package-like back-to-back wafer batch (BTB wafer batch) to be positioned in a process boat, the back-to-back wafer batch consisting of a predetermined even number of wafers disposed in rows, such as solar wafers, to be doped on one side, with each side that is not to be doped abutting congruently the side not to be doped of the respective adjacent wafer, wherein the first and the second half of the predetermined even number of wafers is provided in a standby position in each case by means of a carrier, which is clamped in a horizontal plane with upward facing stacking slots, and moved out of the carrier in succession in the form of a first and a second wafer stack, respectively by means of lifting combs that can travel vertically and are each positioned beneath the carrier, and positioned in succession in a combined lifting position, in which the wafers of the first wafer stack and the second wafer stack are each offset by 180° with respect to one another and aligned to one another and the second wafer stack is joined together with the first wafer stack by positive locking to produce the package-like back-to-back wafer batch (BTB wafer batch), by simultaneously and congruently joining together the sides not to be doped of the wafers of the first and the second wafer stack associated to one another, whereupon the BTB wafer batch is picked up in positively locked form by a transfer gripper and deposited at an insertion position in the process boat.

The invention further relates to a method for forming a package-like back-to-back wafer batch (BTB wafer batch) to be positioned in a process boat, the back-to-back wafer batch consisting of a predetermined even number of wafers disposed in rows, such as solar wafers, to be doped on one side, with each side which is not to be doped abutting congruently the side not to be doped of the respective adjacent wafer, wherein the predetermined number of wafers to be doped on one side is provided in rows in the stacking slots of a carrier, which is clamped in a horizontal plane with upward facing stacking slots, half of the predetermined even number of wafers for the BTB wafer batch to be formed is moved from the carrier and transferred in the form of a first wafer stack by means of a transfer mechanism to the process boat and positioned in an insertion position in its stacking slots, then the other half of the predetermined number of wafers for the BTB wafer batch to be formed is moved from the carrier and transferred by the transfer mechanism to the process boat in the form of a second wafer stack, the wafers of which have previously been offset by 180° with respect to the position of the wafers of the first wafer stack in the insertion position of the process boat, positioned above wafers in alignment with the insertion position of the first wafer stack in the process boat, offset from the insertion position by a distance at least as great as the wafer thickness, and then joined together with the first wafer stack in the insertion position of the process boat, with the sides not to be doped of the wafers of the first and the second wafer stack associated with each other being placed together simultaneously and congruently.

The invention further relates to a handling system for loading a process boat with several insertion positions with wafer batches before doping in a diffusion furnace, with an automatic transfer system by which a carrier fitted with a predetermined even number of wafers can be moved along a horizontal transport plane into a standby position for forming wafer stacks, with a clamping module, from which the carrier must be held aligned with upward facing stacking slots in the standby position, so that the centres of the wafers in the stacking slots of the carrier are precisely aligned with the comb holes of lifting combs that can be moved vertically of a first and a second vertical axis module, which are each rigidly disposed beneath the clamping module in the standby position, wherein the first half of the predetermined number of wafers in the carrier held by the clamping module is moved by the lifting comb of the first vertical axis module as the first wafer stack upwards into a first lifting position and is to be provided here by means of a rotating mechanism in a position offset by 180° with respect to its standby position in the lifting comb of the first vertical axis module and the lifting comb is lowered again, after which the second half of the number of wafers located in the stacking slots of the carrier is lifted into a second lifting position by the lifting comb of the second vertical axis module, then the second wafer stack is moved without rotation into the first lifting position above the first wafer stack, into which the first wafer stack is raised by the lifting comb of the first vertical axis module and inserted in the second wafer stack and the wafers of the first and the second wafer are placed together back-to-back forming a packet-like BTB wafer batch with a doubled doping surface in the lifting comb, and with a transfer gripper, by which the formed BTB wafer batch is moved from the first lifting position to the process boat and deposited at one of the insertion positions.

A handling system for loading and unloading of a process installation with at least one carrier loadable and unloadable with at least one flat substrate for a vertical transport of the substrate, and a method for operating this handling system are principally known from e.g. DE 10 2004 039 787. According to this a first and a second handling module are provided, whereby at least one substrate handling unit is associated with at least one of the handling modules for a substrate transfer separate from the carrier. The carrier is transferable with the vertically aligned substrate between the process installation and the first handling module, the process installation and the second handling module and between both of the handling modules, and the substrate handling unit is designed as a multi-axis robot, preferably with one or more vacuum grippers.

A handling device for the bulk transfer of semiconductor wafers from container to container for processing in the back-to-back configuration is known from U.S. Pat. No. 4,856,957 A. The handling device includes a stage for selectively raising the wafers from a boat upward into a retaining mechanism. The wafers are confined in a back-to-back configuration through a slot in the end of a back-to-back retainer. The back-to-back configured wafers are then removed, processed and then disposed back in the retainer mechanism.

A handling device for automatically transfers semiconductor wafers between plastic wafer boats and closed bottom quartz boats is also known from U.S. Pat. No. 4,840,530 A. The handling device has a wafer elevator for elevating the wafers in a plastic boat to a position where the wafers can be retained by first and second retainer walls. The retainer walls are pivotable relative to one another between open and closed positions. The handling device includes also a turntable that is rotatable over 180 degrees about a vertical axis. In transferring wafers from the plastic boat to the quartz boat the retainer walls pick up one half of the wafers in the plastic boat. The plastic boat is then rotated 180 degrees by rotating the turntable. This reorients the wafers remaining in the plastic boat for back-to-back placement into the quartz boat.

A handling device for bringing two wafers to the state of back adhesion and shifting them to a boat is further known from JP 63 84043 A. This handling device comprises a table on which a plurality of cassettes are placed in which wafers arranged in the forward direction are housed. When the table is moved to a predetermined position, wafer supports for a rotary means are passed through holes in the table and holes in the cassettes and elevated. Thus the wafers are lifted to the upper sections of the cassettes and the directions thereof are changed at 180 degrees. Then the wafers are lowered, thus re-housing the wafers into the cassettes under the state in which they are disposed in the opposite direction. When a base is shifted onto the cassettes in which the wafers in the forward direction are stored, the rotary means transfer the wafers in the forward direction to a holding means in the base. When the base is moved onto the cassettes in which the wafers in the opposite direction are housed, the rotary means insert the wafers in the opposite direction among wafers in the forward direction in the base. An adhesion means in the base fast sticks the wafers back to back, and the wafers are stored in a boat.

For the increase of the efficiency of the production processes of solar cells the automation and acceleration of solar wafer handling, specifically the load and unload process of the process boat by which the solar wafers have to be delivered in and out of the diffusion oven, respectively, is an important factor. The diffusion process requires only the diffusion of one side of the wafer. The solar wafers are fed to the diffusion oven in a process boat typically provided with 200 slots inclined by 3° to the vertical. Such an incline effects a pre-alignment of the solar wafers so that they rest against the flanks of the process boat.

SUMMARY OF THE INVENTION

It is object of the invention to provide a method and a handling system of the aforementioned type, with which an increase of the through-put of the diffusion process and a simultaneous reduction of the scrap rate can be obtained.

This object is procedurally solved according to the invention in that the first half and the second half of the predetermined even number of wafers for the BTB wafer batch to be formed are provided in rows in the stacking slots of only a single carrier, from which the wafers are moved out in the form of the first and the second wafer stack, wherein the first wafer stack is first lifted by the associated lifting comb into a lifting position other than the combined lifting position, picked up from there by a multi-vacuum gripper of a BTB module to be moved in a horizontal direction, controlled by inductive proximity switches, the multi-vacuum gripper is swiveled by rotation through 180° relative to this angle to its place in the standby position and is then positioned by moving the multi-vacuum gripper horizontally in this swiveled position in the combined lifting position, in which following transfer of the second wafer stack by means of the associated lifting comb into the combined lifting position, the second wafer stack and the first wafer stack are joined together, with the wafers of the second wafer stack each being moved along a servo-controlled movement path past the wafers of the first wafer stack positioned in the combined lifting position to the positively-locked cover and then the wafers of the first wafer stack along with the wafers of the second wafer stack being placed back-to-back in the lifting comb associated with the second wafer stack.

The object is solved also according to the invention in that a multi-vacuum gripper of a BTB module is used as the transfer mechanism, by which the first and the second half of the aforementioned even number of wafers for the BTB wafer batch to be formed is removed straight from the carrier in succession in the form of the first and second wafer stacks, respectively, and transferred in succession by servo control to the insertion position of the process boat, wherein the second wafer stack taken from the carrier by the multi-vacuum gripper is swiveled by rotation of the same during transfer to the process boat into the position which is offset by 180° with respect to the position of the first wafer stack already in the insertion position of the process boat.

All insertion positions each with 50 reception slots of the process boat are to be loaded successively in the same way, so that through the Back-To-Back principle according to the invention with 400 solar wafers double of the capacity in a current process boat with 200 reception slots typically inclined by 3° to the vertical is to be achieved.

By reception of respectively two wafers of the BTB wafer batch abutted rear side to rear side (Back-To-Back) in a slot of the process boat, the package density therein and hence also the throughput of the diffusion oven is to be doubled.

Further the object of the invention is achieved according to the invention through the above-mentioned handling system for forming a package-like back-to-back wafer batch (BTB-wafer batch) consisting of wafers, such as solar wafers to be doped on one side characterized in that a back-to-back module (BTB module) with a multi-vacuum gripper with vacuum gripping combs, being disposed above the clamping module and movable in an X-Y-Z and R direction, the vertically oriented axis of which is rotated by a servo motor via a downstream play-free gear and a centring module, by which the number of wafers of the first and second wafer stacks, respectively lifted out of the carrier into the first or second lifting position must be aligned at the side edges with the wafers being at an exact distance from one another in the first and second wafer stack, respectively, wherein the first wafer stack is picked up from the first lifting position by the multi-vacuum gripper of the back-to-back module (BTB module) controlled by inductive proximity switches, swiveled through 180° and without any relative movement in relation to the lifting comb of the first vertical axis module deposited again in this in the position offset at 180° in the first lifting position and the lifting comb is lowered again, after which the second wafer stack moved into the second lifting position is picked up by the multi-vacuum gripper of the back-to-back module (BTB module) and moved without rotation into the first lifting position above the first wafer stack, in which the wafers of the first wafer stack raised by the lifting comb of the first vertical axis module are moved along a servo-controlled movement path past the wafers associated with the second wafer stack and the wafers of the second wafer stack along with the wafers of the first wafer stack are placed back-to-back in the raised lifting comb of the first vertical axis module.

Through the rotary drive of the vertical axis of the BTB module by means of the servo motor via the downstream play-free gear the first wafer stack to be sucked by the multi-vacuum gripper is to be put in rotation with precisely defined start and breaking ramps, whereby jerky swiveling movements are avoided and the scrap rate is reduced. The control of the swiveling movement via a servo motor enables a precise, smooth and hence a stress-free approaching of the desired position for the wafer. The hereby improved possibility of a positioning guarantees a very precise lifting and re-insertion of a wafer stack in a comb, whereby relative movements between wafer and comb are avoided.

The multi-vacuum gripper of the BTB module advantageously comprises an upper part connected to the vertical axis thereof and a bottom part supporting vacuum-gripping combs, whereby the upper part and the bottom part are connected via two ball screw guide elements and are kept by them precisely aligned during a movement and two inductive sensors are provided at the upper part of the multi-vacuum gripper by which upon lowering of the multi-vacuum gripper an abutting of the bottom side of the vacuum-gripping combs upon the upper front faces of the wafers located in the lifting comb is to be detected and a further lowering of the multi-vacuum gripper is to be blocked with minimal delay. By means of the improved reaction time there is only a minor force effect on the solar wafers in case of the abutting.

Preferably the multi-vacuum-gripper comprises 50 vacuum-gripping combs by which 50 solar wafers are to be gripped.

There are 100 solar wafers to provide in the carrier, which are to be fed by the lifting comb of the first and the second vertical-drive module in the form of the first and the second wafer stack, respectively, each with 50 wafers, to the BTB module, by which the first and the second wafer stack are to be joined together to a package-like BTB wafer batch with 100 wafers abutted back-to-back, whereby in the process boat consisting of silica preferably 4 loading compartments are provided, in each of which one package-like BTB wafer batch is to be deposited by the transfer gripper.

Preferably the comb walls of the vacuum gripping combs of the multi-vacuum gripper, which define the reception slots of each vacuum gripping comb and engage with the side surfaces of the wafers, are each shaped in the form of a frame-like bezel having fins parallel and horizontal extending to each other, with respectively one vacuum slot formed therebetween oriented at an angle to the comb wall, whereby the supporting surface of each comb wall engaging with one of the side surfaces of the associated wafer is formed by the outer surface of the frame-like bezel of the fins and the front edges of the fins which lie in the vertical plane, in which the outer surface of the frame-like bezel lies, whereby the contact pressure per unit area of the wafer is minimized.

The invention provides an increase of throughput capacity during the doping process in the diffusion ovens without the need to change their size or design, and a considerable reduction of the total processing time. Furthermore the transport, handling and positioning operations are specified more precisely, which results in a reduction of the damage and/or fracture rate and a decrease of the doping failure rate. A retrofitting of the handling systems according to the invention in conventional installations for loading and unloading of process boats with wafers is readily possible.

BRIEF DESCRIPTION OF THE DRAWINGS

The invention is now described by means of the drawings, in which.

DETAILED DESCRIPTION

Figure 1:
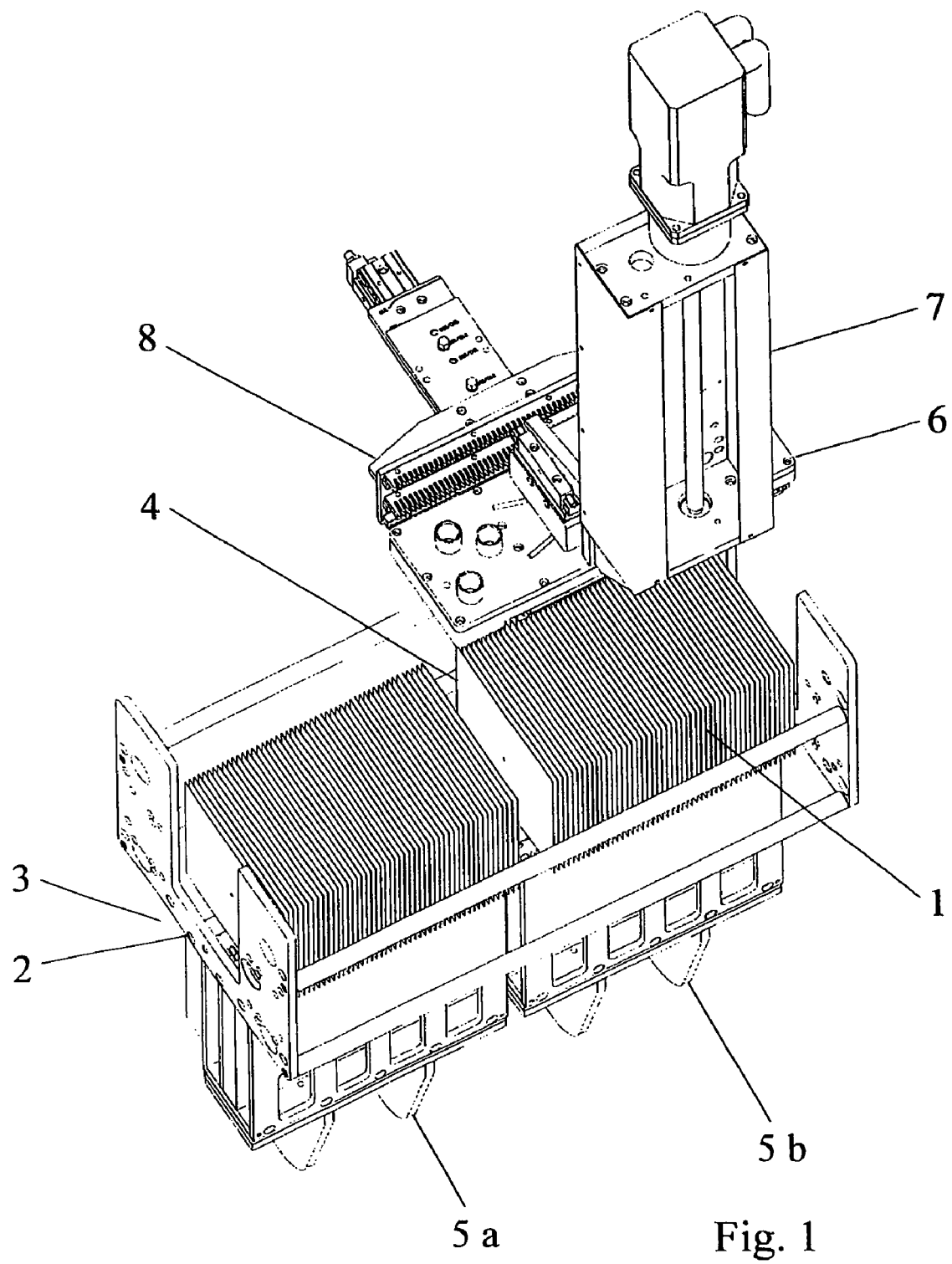
FIG. 1 is a perspective view of a provided carrier filled with 2×50 wafers above which a fiftyfold vacuum gripper of a BTB module is arranged, and with a laterally arranged side centring.

As can be taken from FIG. 1 preferably a carrier 2 filled with 2×50 solar wafers 1 is aligned and clamped in a clamping module 3 in a manner that the stacking opening 4 thereof is facing upward. Beneath the carrier 2 in vertical direction two moveable lifting combs 5a and 5b are arranged, while above the carrier 2 a fiftyfold vacuum gripper 6 of a Back-To-Back module (BTB module) 7 is arranged, as illustrated separately in FIG. 10. Two linear moveable centring combs 8 are also positioned above the carrier 2 on the left (FIG. 1) and on the right (FIG. 2) as side centring.

Figure 2:
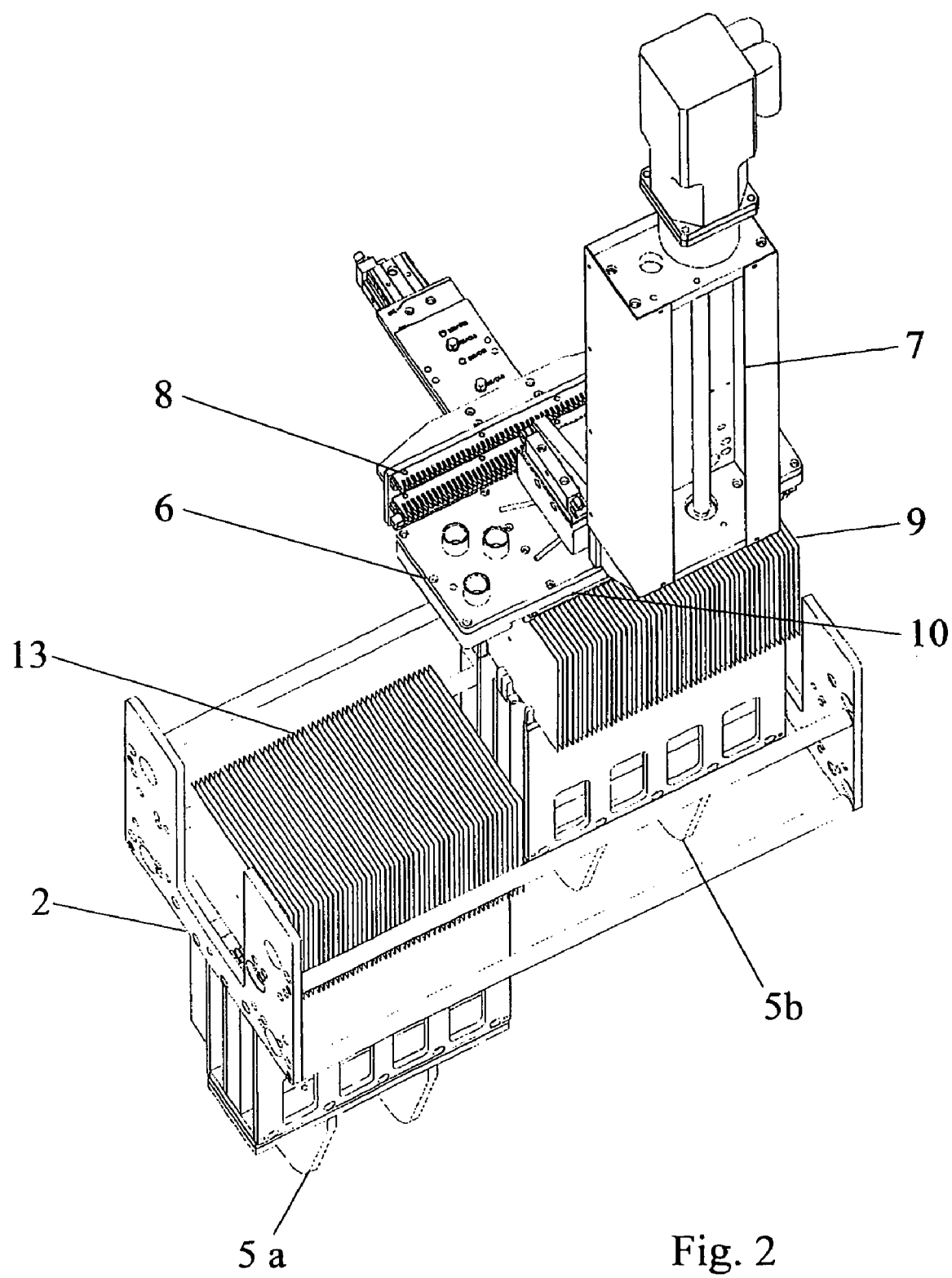
FIG. 2 is perspective view corresponding to FIG. 1 but with a lifted first wafer stack with 50 wafers.
Figure 3:
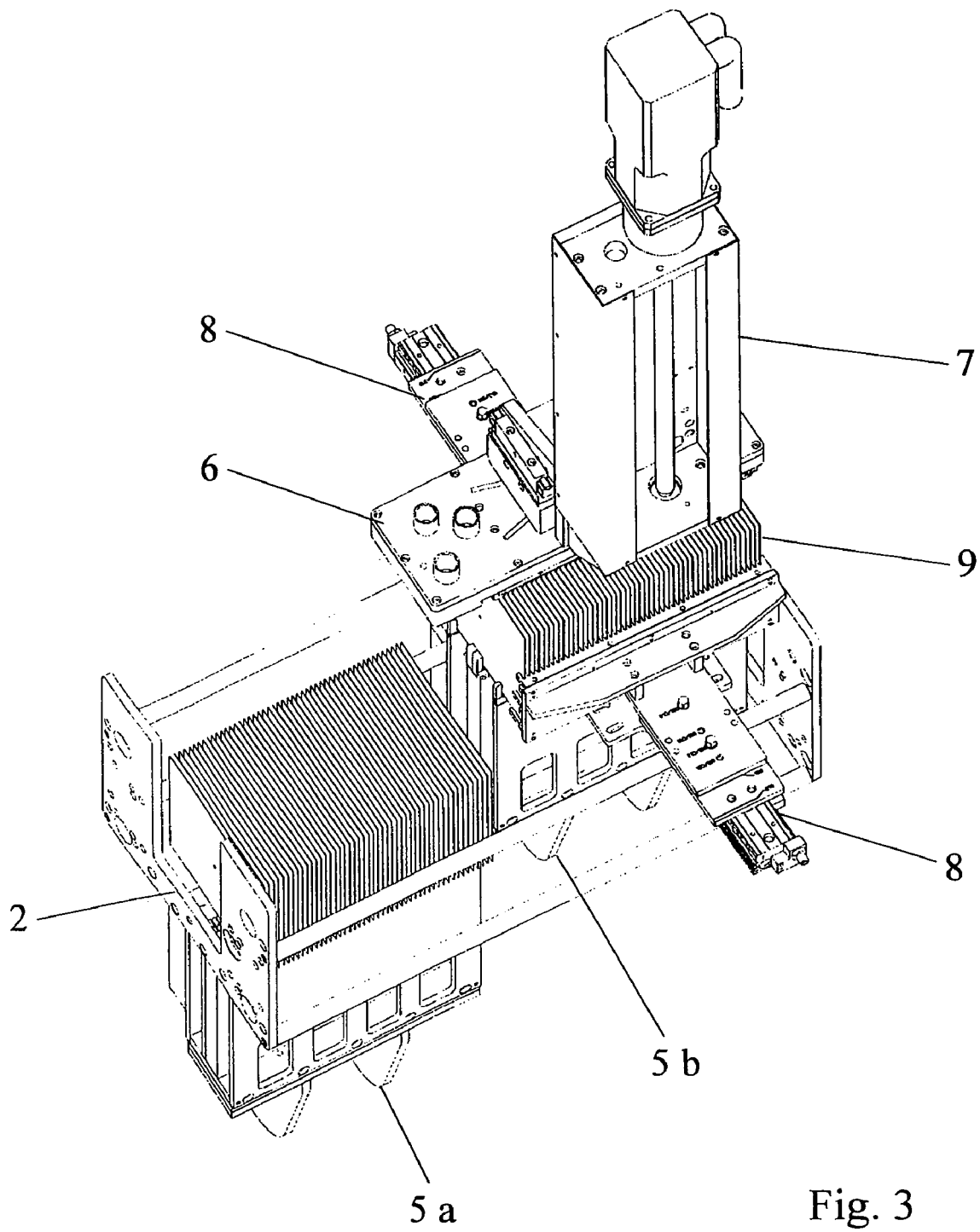
FIG. 3 is a perspective view corresponding to FIG. 2 but with two laterally arranged side centrings.
Figure 4:
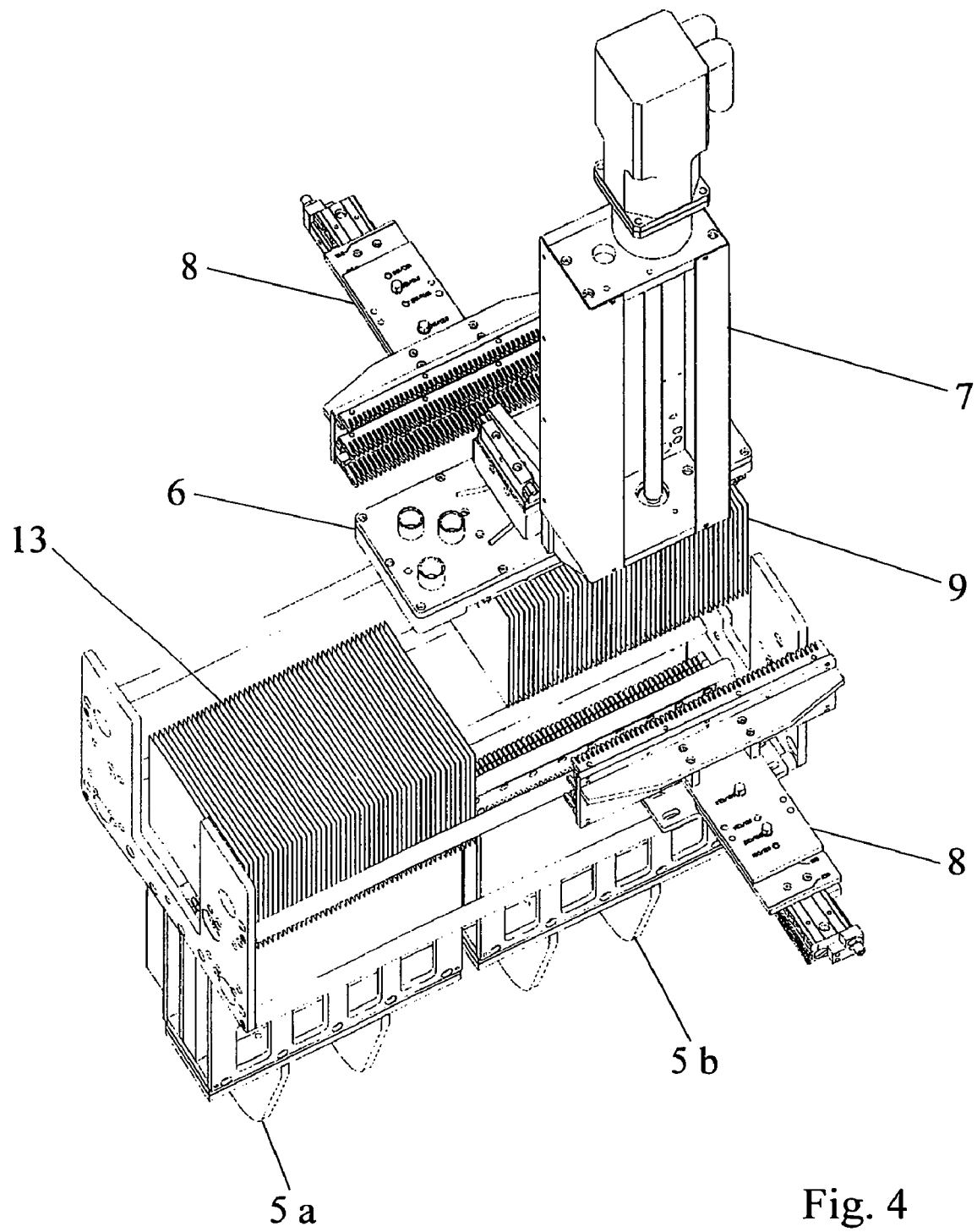
FIG. 4 is a perspective view corresponding to FIG. 3 but with the first wafer stack picked up by the vacuum gripper of the BTB module with relieved lifting comb.

At first, by the right lifting comb 5a in FIG. 2, the comb gaps of which are aligned exactly with the centres of a first half of a number of the wafers 1 provided in carrier 2, fifty of wafers 1 provided in carrier 2 are transferred as first wafer stack 9 in a lifting position, are centred there laterally by the centring combs 8 and subsequently picked up by the fiftyfold vacuum gripping comb 10 of the vacuum gripper 6 movable in X-Y-Z and R-direction of the BTB module 7, as seen in FIG. 4.

Figure 10:
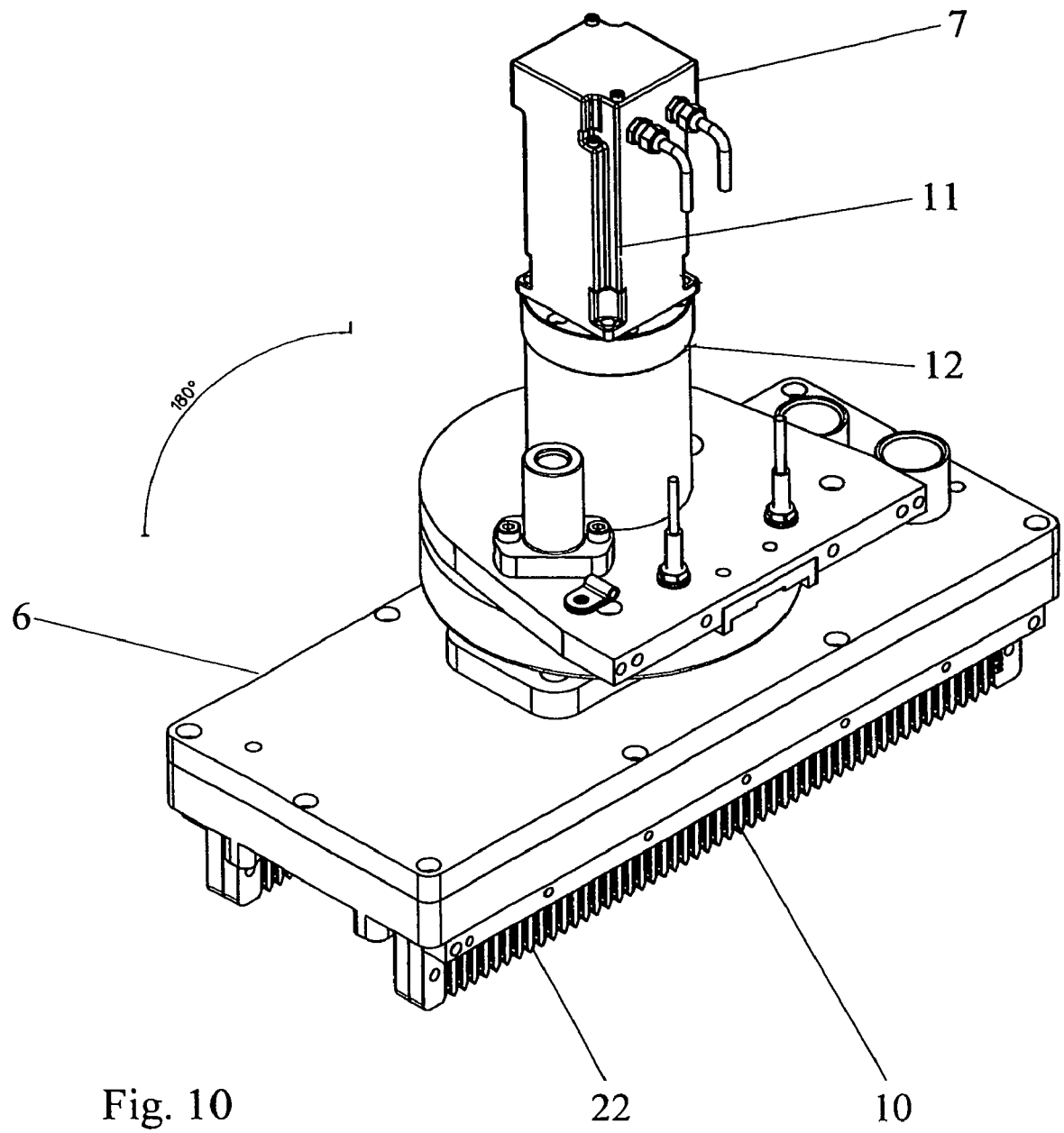
FIG. 10 is a perspective illustration of the BTB module with a multi-vacuum gripper, which is to be put in rotation around its vertical axis by means of a servo motor via a downstream play-free gear.

As follows from FIG. 10, the vacuum gripper 6 with vacuum gripping comb 10 of the BTB-module 7 is to be put in rotation around its vertical axis by a servo motor 11 via a downstream play-free gear 12.

Figure 5:
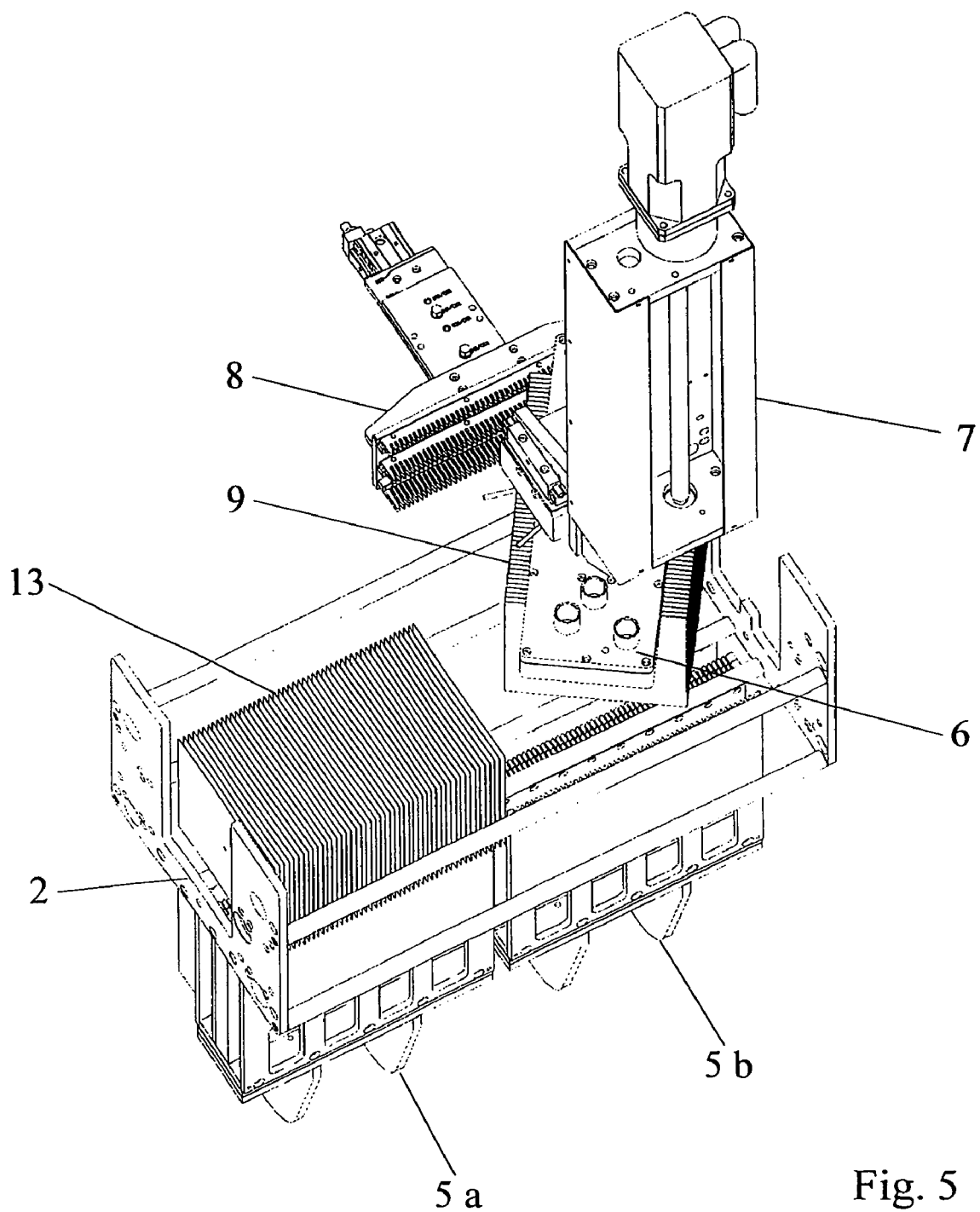
FIG. 5 is a perspective view corresponding to FIG. 4 but in process to swivel the first wafer stack by means of the BTB module.
Figure 6:
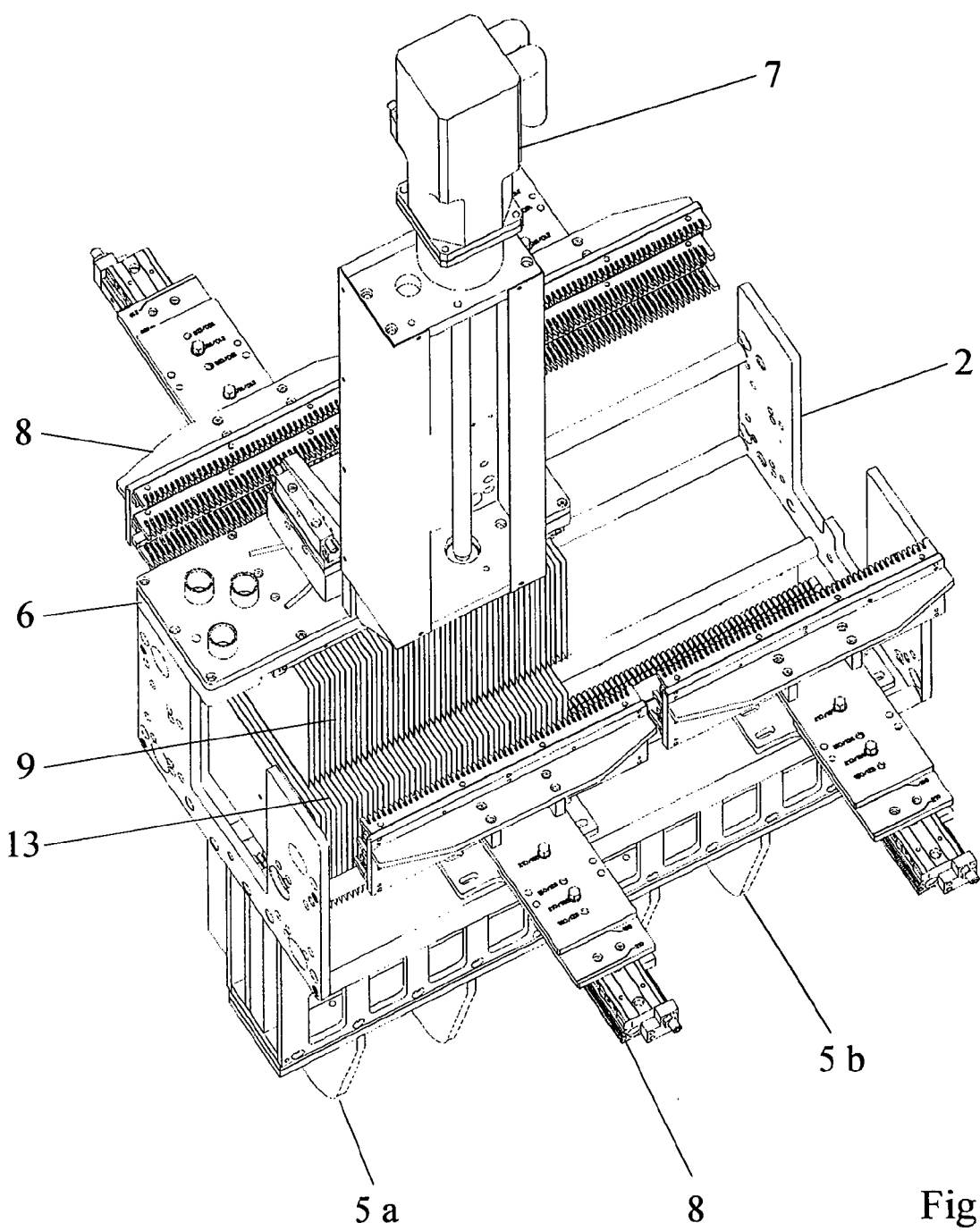
FIG. 6 is a perspective view corresponding to FIG. 4 but after swiveling of the first wafer stack by means of the BTB module by 180° relative to the position of the second wafer stack in the carrier and in standby position of the first wafer stack above the second wafer stack located in the carrier.

According to FIG. 5 therefore the first wafer stack 9 picked up by the 50-fold vacuum-gripping comb 10 of the vacuum gripper 6 is swiveled by rotation of the vacuum gripper 6 by 180° and by this very angle relative to its initial position in carrier 2 and transferred by moving the vacuum gripper 6 in horizontal direction into a standby position above the second half of the 100 wafers 1 still remaining and provided in carrier 2 (FIG. 6).

Figure 7:
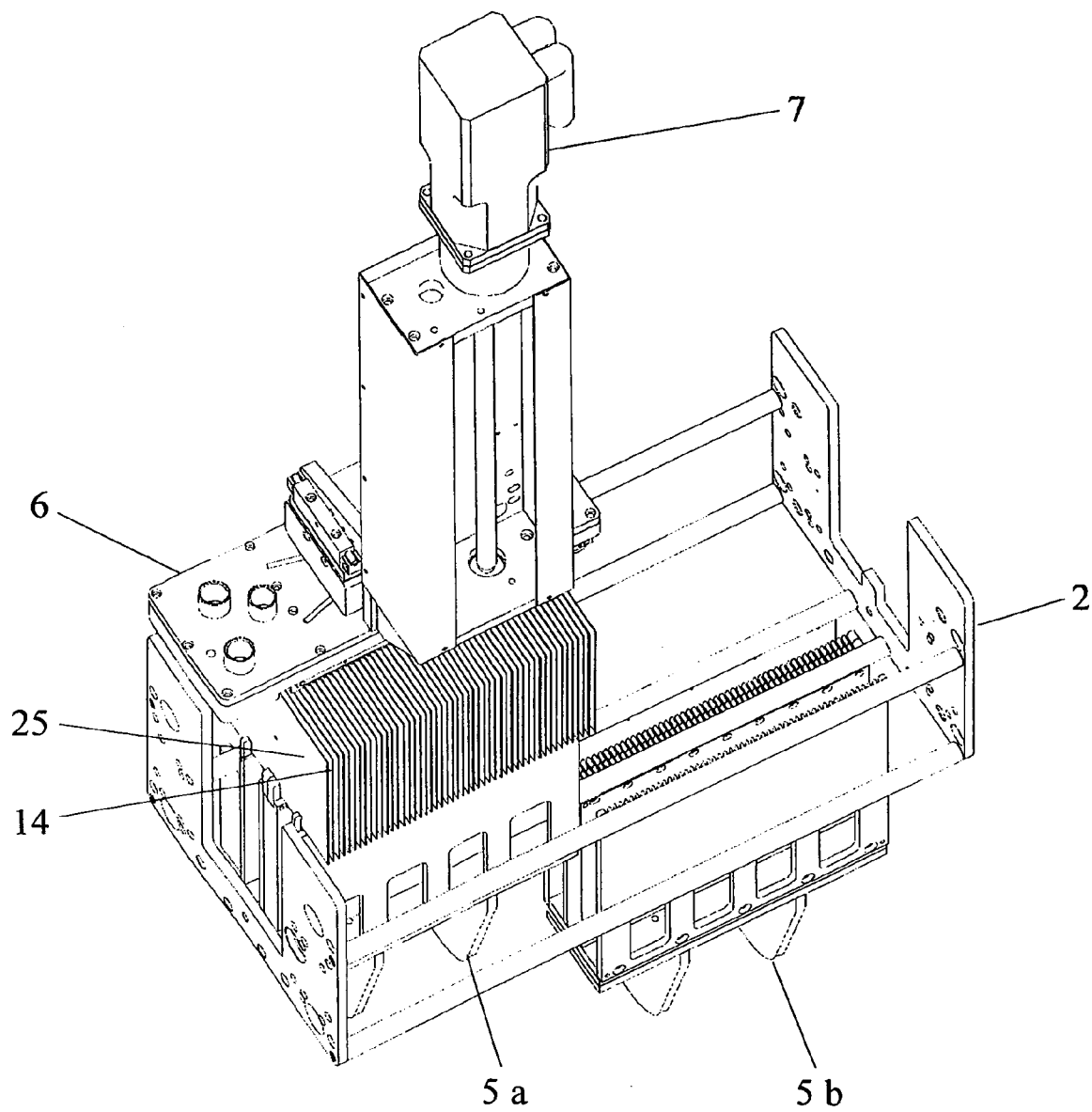
FIG. 7 is a perspective view corresponding to FIG. 5 but after lifting of the second wafer stack out of the carrier and joining together with the first wafer stack provided in the lifted position while forming a package-like BTB wafer batch.
Figure 8:
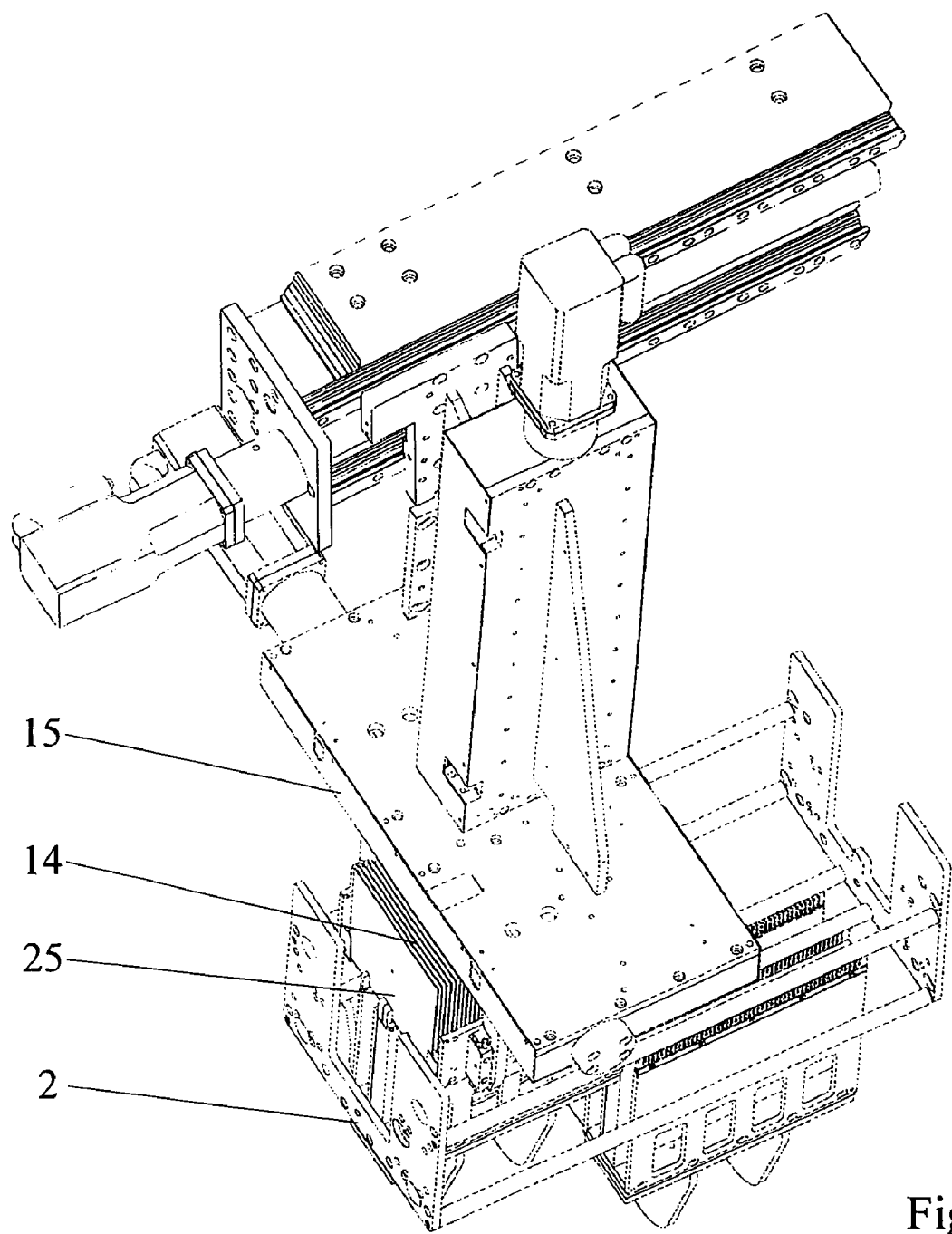
FIG. 8 is a perspective illustration of a transfer gripper during pick-up of the package-like BTB wafer batch in the position seen in FIG. 7.
Figure 9:
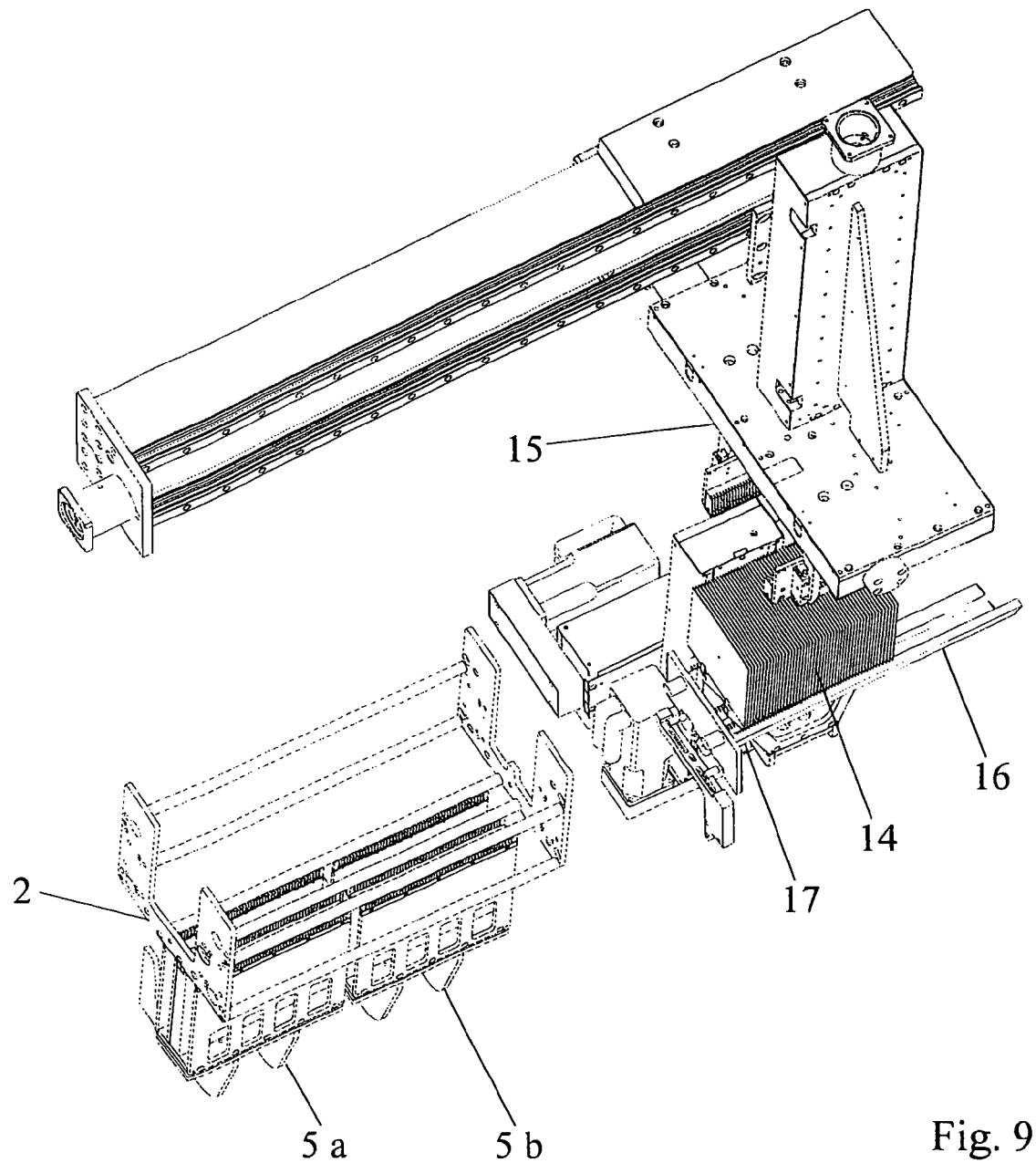
FIG. 9 is a perspective illustration of the transfer gripper above an insertion position of the process boat in which the BTB wafer batch after transfer by the transfer gripper is deposited by the same, and of the emptied carrier with lifting combs arranged beneath the same.

After that second half of the number of the provided 100 wafers 1 remaining in carrier 2 is lifted as second wafer stack 13 by the second lifting comb 5*b*, the comb gaps of which are aligned exactly with the centres of the wafers 1 which remained in carrier 2, and moved to the second lifting position, which corresponds to the standby position of the first wafer stack 9. Thereby the wafers 1 of the second wafer stack 13 are moved along a servo-controlled movement path past the associated wafers 1 of the first wafer stack 9 positioned swiveled by 180° in the standby position respectively until form fitting congruence and then abutted against them while forming a package-like Back-To-Back wafer batch (BTB wafer batch) 14, as shown in FIG. 7. The BTB wafer batch 14 formed in such a manner is picked up as form fitting by a transfer gripper 15 from the standby position, transferred to a process boat 16 with four insertion positions 17 and inserted in one of the insertion positions 17 (FIG. 9).

The process boat 16 is therefore altogether to be loaded with 400 solar wafers for a diffusion process in a diffusion oven.

Figure 11:
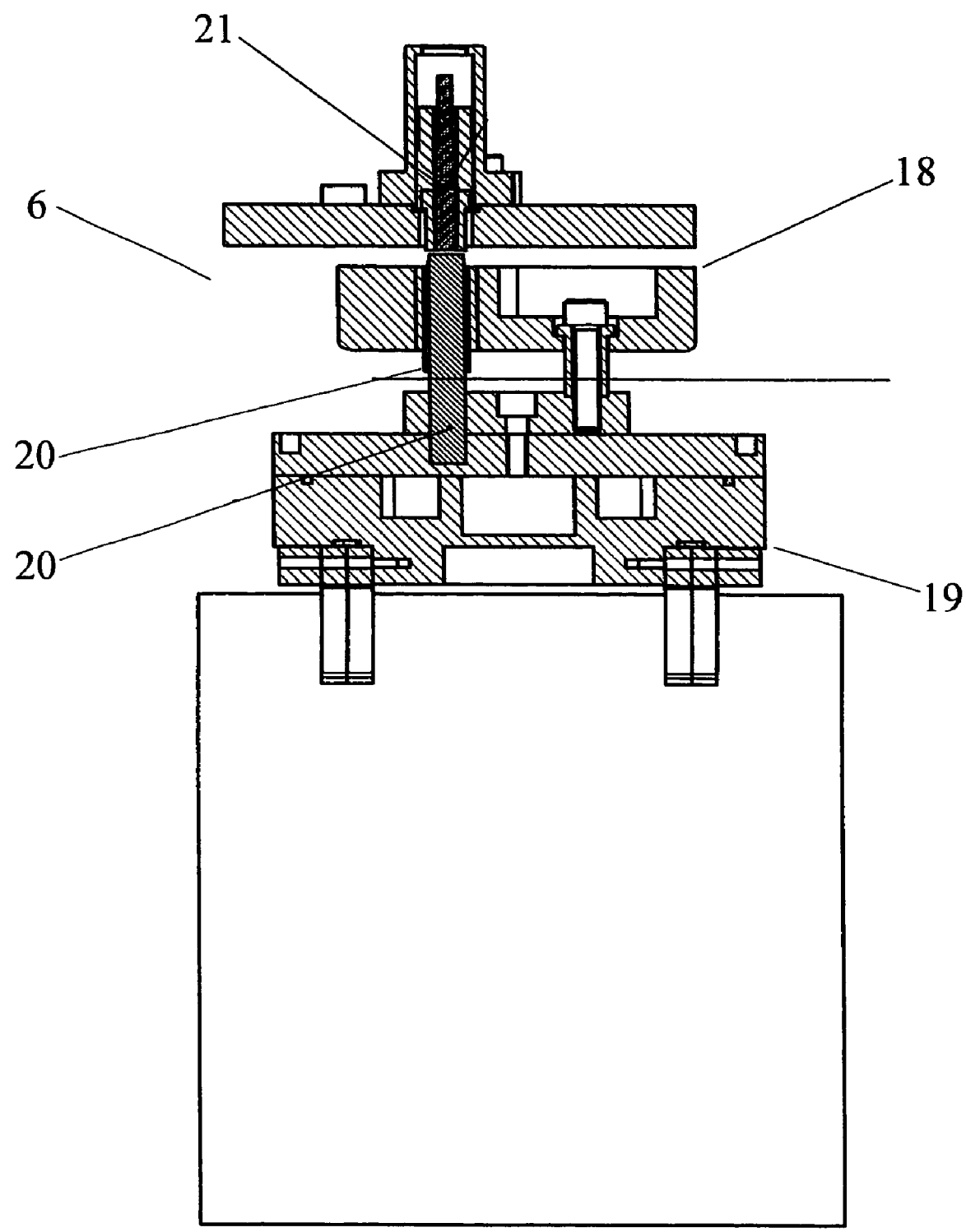
FIG. 11 is a schematic sectional view of the multi-vacuum gripper of the BTB-module.

As can be seen from the detailed sectional view of the vacuum gripper 6 of the BTB module 7 according to FIG. 11, the vacuum gripper 6 comprises an upper part 18 connected with its vertical axis and a bottom part 19 receiving the vacuum gripping comb 10, whereby upper part 18 and bottom part 19 are connected via two ball bearing guide elements 20 and kept precisely aligned by them during a movement. On the upper part 18 there are further provided two sensors 21 by which upon lowering of the vacuum gripper 6 an abutting of the bottom side 22 (FIG. 10) of the vacuum-gripping comb 10 upon the upper front face of the wafers 1 located in the lifting combs 5*a*, 5*b* is detected. The employment of the smooth running ball bearing guide elements 20 improves the reaction time considerably, so that in case of an abutting there is a lower force effect on the wafers 1.

Figure 12:
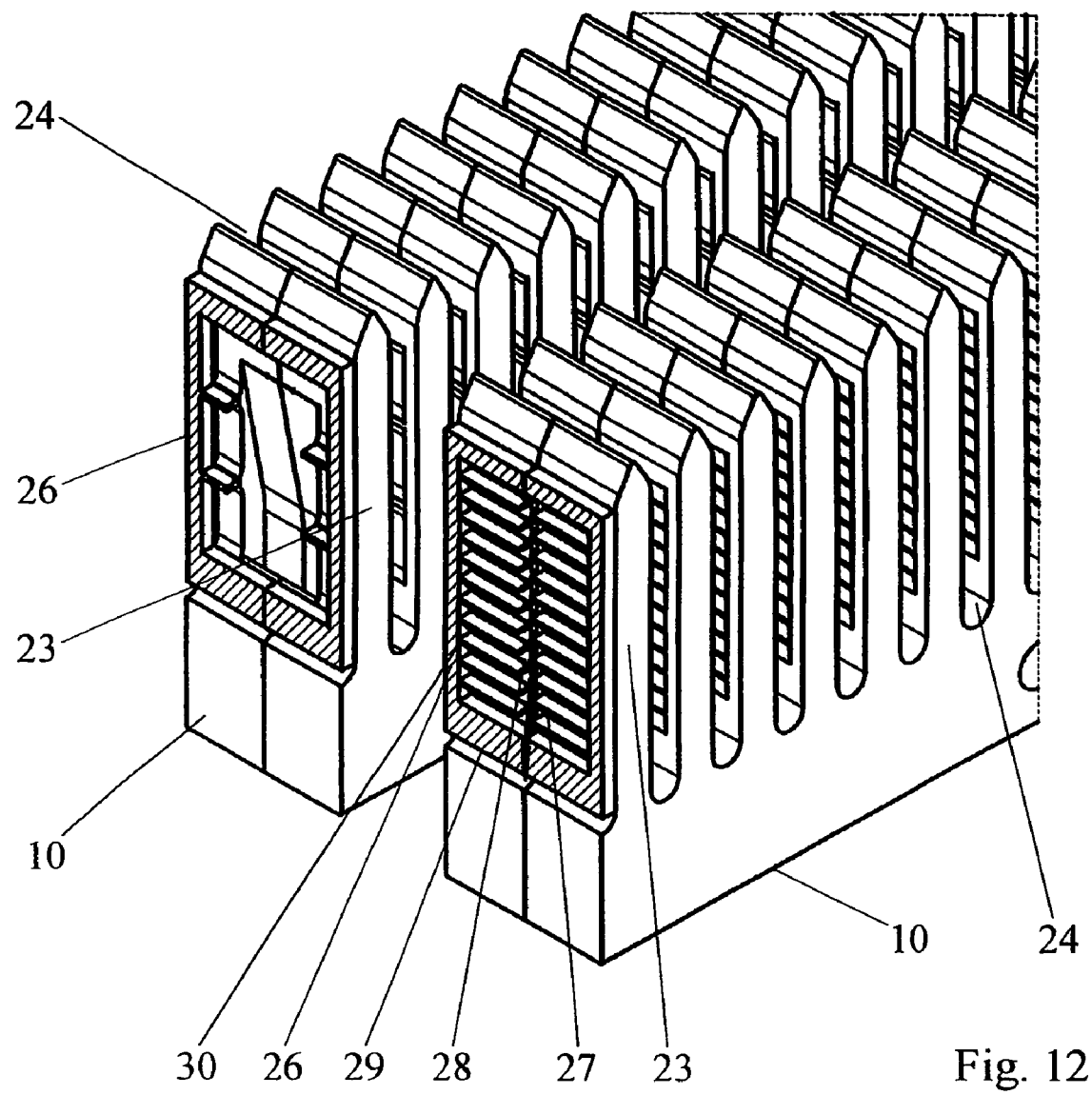
FIG. 12 is a perspective partial sectional view of the vacuum gripping combs of the multi-vacuum gripper in two different embodiments.

From FIG. 12 are following finally two possible embodiments of the vacuum comb geometry, in which the comb walls 23 of the vacuum gripping combs 10 of the multi-vacuum gripper 6 of the BTB module 7, which define the reception slots 24 of each vacuum gripping comb 10 and engage with the side surfaces 25 of wafers 1 respectively have a frame-like bezel 26. In the front embodiment of FIG. 12 the frame-like bezel 26 is advantageously designed with fins 27 which extend parallel and horizontal to each other, between which respectively a vacuum slot 28 oriented at an angle to the comb wall 23 is formed. Hereby thus the supporting surface of each comb wall 23 engaging with one of the side surfaces 25 of the associated wafer 1 is formed by the outer surface 29 of the frame-like bezel 26 of the fins 27 and the front edges 30 of the fins 27 which lie in the vertical plane in which the outer surface 29 of the frame-like bezel 26 lies. Hereby the contact pressure per unit area of each wafer 1 is minimized which results in a considerable decrease of the damage and fracture rate.

REFERENCE LIST

1 Wafer, solar wafer
2 Transfer carrier, carrier
3 Clamping module
4 Stacking opening
5*a*, 5*b* Lifting combs
6 Vacuum gripper, multi-vacuum-gripper
7 Back-To-Back module, BTB module
8 Centring combs
9 First wafer stack
10 Vacuum gripping combs
11 Servo motor
12 Play-free gear
13 Second wafer stack
14 Back-To-Back wafer batch, BTB wafer batch
15 Transfer gripper
16 Process boat
17 Insertion position
18 Upper part of vacuum gripper
19 Bottom part of vacuum gripper
20 Ball bearing guide elements
21 Inductive sensors
22 Bottom side of vacuum-gripping combs
23 Comb walls
24 Reception slots of vacuum-gripping combs
25 Side surfaces of wafers
26 Frame-like bezel
27 Fins
28 Vacuum slots
29 Outer surface of frame-like bezel
30 Front edges of fins

The invention claimed is:

1. A method of forming a package-like back-to-back wafer batch (BTB wafer batch) (14) to be positioned in a process boat (16), the back-to-back wafer batch consisting of a predetermined even number of wafers (1) disposed in rows, such as solar wafers, to be doped on one side, with each side (25) that is not to be doped abutting congruently the side (25) not to be doped of the respective adjacent wafer (1), comprising the steps of:

providing the first and the second half of the predetermined even number of wafers (1) in a standby position in each case by means of a carrier (2), which is clamped in a horizontal plane with upward facing stacking slots;

moving the first and the second half of the predetermined even number of wafers (1) out of the carrier (2) in succession in the form of a first and a second wafer stack, respectively (9 and 13, respectively) by means of lifting combs (5*a*; 5*b*) that can travel vertically and are each positioned beneath the carrier (2);

positioning the first and the second wafer stack in succession in a combined lifting position;

wherein the wafers (1) of the first wafer stack (9) and the second wafer stack (13) are each offset by 180° with respect to one another and aligned to one another and the second wafer stack (13) is joined together with the first wafer stack (9) by positive locking to produce the package-like back-to-back wafer batch (BTB wafer batch) (14), by simultaneously and congruently joining together the sides not to be doped of the wafers (1) of the first and the second wafer stack (9 and 13, respectively) associated to one another, whereupon the following steps are performed:

picking up the BTB wafer batch (14) in positively locked form by a transfer gripper (15); and depositing the BTB wafer batch (14) at an insertion position in the process boat (16), wherein, the first half and the second half of the predetermined even number of wafers (1) for the BTB wafer batch (14) to be formed are provided in rows in the stacking slots of only a single carrier (2), the wafers (1) are moved out from the single carrier (2) in the form of the first and the second wafer stack (9 and 13, respectively), and wherein the first wafer stack (9) is first lifted by the associated lifting comb (5*a*) into a lifting position other than the combined lifting position, whereupon the following steps are performed:

picking up the first wafer stack (9) from there by a multi-vacuum gripper (6) of a BTB module (7) to be moved in a horizontal direction, controlled by inductive proximity switches;

swivelling the first wafer stack (9) by rotation of the multi-vacuum gripper (6) through 180° through this angle relative to its place in the standby position;

positioning the first wafer stack (9) by moving the multi-vacuum gripper (6) horizontally in this swivelled position in the combined lifting position, transferring the second wafer stack (13) by means of the associated lifting comb (5b) into the combined lifting position, joining the second wafer stack (13) and the first wafer stack (9) together, wherein the wafers (1) of the second wafer stack (13) each being moved along a servo-controlled movement path past the wafers (1) of the first wafer stack (9) positioned in the combined lifting position to the positively-locked cover; and then the wafers (1) of the first wafer stack (9) along with the wafers (1) of the second wafer stack (13) being placed back-to-back in the lifting comb (5b) associated with the second wafer stack (13).

2. A method for forming a package-like back-to-back wafer batch (BTB wafer batch) (14) to be positioned in a process boat (16), the back-to-back wafer batch consisting of a predetermined even number of wafers (1) disposed in rows, such as solar wafers, to be doped on one side, with each side (25) which is not to be doped abutting congruently the side (25) not to be doped of the respective adjacent wafer (1), comprising the steps of:

providing the predetermined number of wafers (1) to be doped on one side in rows in the stacking slots of a carrier (2), which is clamped in a horizontal plane with upward facing stacking slots(4), moving a first half of the predetermined even number of wafers (1) for the BTB wafer batch (14) to be formed from the carrier (2)

transferring the first half of predetermined even number of wafers in the form of a first wafer stack (9) by means of a transfer mechanism (15) to the process boat (16)

positioning the first half of predetermined even number of wafers in an insertion position in its stacking slots, moving a second half of the predetermined number of wafers (1) for the BTB wafer batch (14) to be formed from the carrier (2)

transferring the second half of predetermined even number of wafers by the transfer mechanism (15) to the process boat (16) in the form of a second wafer stack (13), wherein the wafers (1) of the second wafer stack (13) have previously been offset by 180° with respect to the position of the wafers (1) of the first wafer stack (9) in the insertion position of the process boat (16), positioned above wafers (1) in alignment with the insertion position of the first wafer stack (9) in the process boat (16), offset from the insertion position by a distance at least as great as the wafer thickness, and then joined together with the first wafer stack (9) in the insertion position of the process boat (16), with the sides not to be doped of the wafers (1) of the first and the second wafer stack (9 and 13, respectively) associated with each other being placed together simultaneously and congruently, and wherein a multi-vacuum gripper (15) of a BTB module (7) is used as the transfer mechanism, the first half of the predetermined even number of wafers (1) for the BTB wafer batch (14) to be formed is removed by the multi-vacuum gripper (15) of the BTB module (7) straight from the carrier (2) in the form of the first wafer stack (9) and then transferred by servo control to the insertion position of the process boat (16), in succession, the second half of the predetermined even number of wafers (1) for the BTB wafer batch (14) to be formed is removed in form of the second wafer stack (13) by the multi-vacuum gripper (15) of the BTB module (7) straight from the carrier (2) and transferred in succession by servo control to the process boat (16), and wherein the second wafer stack (13) taken from the carrier (2) by the multi-vacuum gripper (15) is swivelled by rotation of the multi-vacuum gripper (15) during transfer to the process boat (16) into the position which is offset by 180° with respect to the position of the first wafer stack (9) already in the insertion position of the process boat (16).

3. A handling system for loading a process boat (16) with several insertion positions (17) with wafer batches (14) before doping in a diffusion furnace, with an automatic transfer system by which a carrier (2) fitted with a predetermined even number of wafers (1) can be moved along a horizontal transport plane into a standby position for forming wafer stacks (9; 13), with a clamping module (3), from which the carrier (2) must be held aligned with upward facing stacking slots in the standby position, so that the centres of the wafers (1) in the stacking slots of the carrier (2) are precisely aligned with the comb holes of lifting combs (5a; 5b) that can be moved vertically of a first and a second vertical axis module, which are each rigidly disposed beneath the clamping module (3) in the standby position, wherein the first half of the predetermined number of wafers (1) in the carrier (2) held by the clamping module (3) is moved by the lifting comb (5a) of the first vertical axis module as the first wafer stack upwards into a first lifting position and is to be provided here by means of a rotating mechanism in a position offset by 180° with respect to its standby position in the lifting comb (5a) of the first vertical axis module and the lifting comb (5a) is lowered again, after which the second half of the number of wafers (1) located in the stacking slots of the carrier (2) is lifted into a second lifting position by the lifting comb (5b) of the second vertical axis module, then the second wafer stack (13) is moved without rotation into the first lifting position above the first wafer stack (9), into which the first wafer stack (9) is raised by the lifting comb (5a) of the first vertical axis module and inserted in the second wafer stack (13) and the wafers (1) of the first and the second wafer stack (9 and 13, respectively) are placed together back-to-back forming a packet-like BTB wafer batch (14) with a doubled doping surface in the lifting comb (5b), and with a transfer gripper (15), by which the formed BTB wafer batch (14) is moved from the first lifting position to the process boat (16) and deposited at one of the insertion positions, the improvement comprising:

a back-to-back module (BTB module) (7) with a multi-vacuum gripper (6) with vacuum gripping combs (10), the back-to-back module (7) being disposed above the clamping module (3) and movable in an X-Y-Z and R direction, a vertically oriented axis of which is adapted to be rotated by a servo motor (11) via a downstream play-free gear (12) and a centring module (8), by which the number of wafers (1) of the first and second wafer stacks, respectively (9 and 13, respectively) lifted out of the carrier (2) into the first or second lifting position must be aligned at the side edges with the wafers (1) being at an exact distance from one another in the first and second wafer stack, respectively (9 and 13, respectively), wherein the first wafer stack (9) is adapted to be picked up from the first lifting position by the multi-vacuum gripper (6) of the back-to-back module (BTB module) (7) controlled by inductive proximity switches, swivelled through 180° and without any relative movement in relation to the lifting comb (5a) of the first vertical axis module deposited again in this in the position offset at 180° in the first lifting position and the lifting comb (5a) is lowered again, and wherein, the second wafer stack (13), adapted to be moved into the second lifting position, and is adapted to be picked up by the multi-vacuum gripper (6) of the back-to-back module (BTB module) (7) and moved without rotation into the first lifting position above the first wafer stack (9), after the first lifting stack is picked up from the first lifting position, and wherein the wafers (1) of the first wafer stack (9) raised by the lifting comb (5a) of the first vertical axis module are adapted to be moved along a servo-controlled movement path past the wafers (1) associated with the second wafer stack (13) and the wafers (1) of the second wafer stack (13) along with the wafers (1) of the first wafer stack (9) are adapted to be placed back-to-back in the raised lifting comb (5a) of the first vertical axis module.

4. The handling system according to claim 3, wherein the multi-vacuum-gripper (6) of the BTB-module (7) comprises an upper part (18) connected to the vertical axis thereof and a bottom part (19) supporting vacuum gripping combs (10), that the upper part (18) and the bottom part (19) are connected via two ball screw guide elements (20) and are kept by them precisely aligned during a movement and that two inductive sensors (21) are provided at the upper part (18) of the multi-vacuum-gripper (6) by which upon lowering of the multi-vacuum-gripper (6) an abutting of the bottom side (22) of the vacuum gripping combs (10) upon the upper front faces of the wafers (1) located in the carrier (2) is to be detected and a further lowering of the multi-vacuum-gripper (6) is to be blocked with minimal delay.

5. The handling system according to claim 4, wherein the multi-vacuum-gripper (6) comprises 50 vacuum-gripping combs by which 50 solarwafers (1) are to be gripped.

6. The handling system according to claim 3, wherein the multi-vacuum-gripper (6) comprises 50 vacuum-gripping combs by which 50 solarwafers (1) are to be gripped.

7. The handling system according to claim 3, wherein the comb walls (23) of the vacuum gripping combs (10) of the multi-vacuum-gripper (6), which define the reception slots (24) of each vacuum gripping comb (10) and engage with the side surfaces (25) of the wafers (1), are each shaped in the form of a frame-like bezel (26) having fins (27) parallel and horizontal extending to each other, with respectively one vacuum slot (28) formed therebetween oriented at an angle to the comb wall (23), and that the supporting surface (29) of each comb wall (23) engaging with one of the side surfaces (25) of the associated wafer (1) is formed by the outer surface (29) of the frame-like bezel (26) of the fins (27) and the front edges (30) of the fins (27) which lie in the vertical plane, in which the outer surface (29) of the frame-like bezel (26) lies, whereby the contact pressure per unit area of the wafer (1) is minimized.

* * * * *